(12) United States Patent
Ushijima et al.

(10) Patent No.: US 7,382,137 B2
(45) Date of Patent: Jun. 3, 2008

(54) POTENTIAL MEASURING APPARATUS

(75) Inventors: Takashi Ushijima, Yokohama (JP);
Yoshikatsu Ichimura, Tokyo (JP);
Atsushi Kandori, Ebina (JP);
Yoshitaka Zaitsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/434,780

(22) Filed: May 17, 2006

(65) Prior Publication Data

US 2006/0267578 A1 Nov. 30, 2006

(30) Foreign Application Priority Data

May 27, 2005 (JP) ............... 2005-156461

(51) Int. Cl.
*G01R 29/12* (2006.01)
(52) U.S. Cl. ...................... 324/458; 324/457
(58) Field of Classification Search ................ 324/458, 324/658, 660, 457
See application file for complete search history.

(56) References Cited

U.S. PATENT DOCUMENTS

| | | | |
|---|---|---|---|
| 3,852,667 A | 12/1974 | Williams et al. | |
| 4,205,267 A | 5/1980 | Williams | |
| 4,720,682 A | 1/1988 | Ikushima et al. | |
| 4,763,078 A | 8/1988 | Williams | |
| 4,835,461 A | 5/1989 | Snelling | |
| 5,212,451 A | 5/1993 | Werner, Jr. | |
| 5,317,152 A | 5/1994 | Takamatsu et al. | |
| 5,357,108 A | 10/1994 | Suzuki et al. | |
| 5,554,851 A | 9/1996 | Hirai et al. | |
| 5,574,279 A | 11/1996 | Ikeda et al. | |
| 5,767,687 A * | 6/1998 | Geist .......................... 324/664 |
| 5,923,637 A | 7/1999 | Shimada et al. | |
| 6,046,972 A | 4/2000 | Kuroda et al. | |
| 6,075,639 A | 6/2000 | Kino et al. | |
| 6,163,032 A * | 12/2000 | Rockwood ............... 250/396 R |
| 6,163,519 A | 12/2000 | Kuroda et al. | |
| 6,177,800 B1 | 1/2001 | Kubby et al. ............... 324/458 |
| 6,337,477 B1 | 1/2002 | Shimada et al. | |
| 6,633,172 B1 * | 10/2003 | Doemens et al. ........... 324/661 |

(Continued)

FOREIGN PATENT DOCUMENTS

DE 27 15 831 A1 10/1978

(Continued)

OTHER PUBLICATIONS

C.H. Hsu, et al., "Micromechanical Electrostatic Voltmeter" Transducers, San Francisco, Jun. 24-27, 1991, Proceedings of the International Conference on Solid State Sensors and Actuators, New York, IEEE, U.S., pp. 659-662.

(Continued)

*Primary Examiner*—Diego Gutierrez
*Assistant Examiner*—Amy He
(74) *Attorney, Agent, or Firm*—Fitzpatrick, Cella, Harper & Scinto

(57) ABSTRACT

A potential measuring apparatus has a detection electrode on which an electric charge is induced according to a potential of a detection object, and a modulator for altering the generated quantity of the electric charge. The detection electrode has at least one depressed portion on a surface opposite to the detection object.

7 Claims, 6 Drawing Sheets

U.S. PATENT DOCUMENTS

| | | | |
|---|---|---|---|
| 6,806,717 B2 * | 10/2004 | Werner et al. | 324/458 |
| 6,831,765 B2 | 12/2004 | Yasuda et al. | |
| 6,965,239 B2 | 11/2005 | Yasuda et al. | |
| 7,149,442 B2 | 12/2006 | Ushijima et al. | 399/48 |
| 7,212,007 B2 | 5/2007 | Yasuda et al. | 324/458 |
| 7,242,882 B2 | 7/2007 | Ichimura et al. | 399/48 |
| 7,265,554 B2 | 9/2007 | Ichimura et al. | 324/458 |
| 7,274,193 B2 | 9/2007 | Yasuda et al. | 324/458 |
| 2003/0042907 A1 | 3/2003 | Kieres et al. | |
| 2003/0057977 A1 | 3/2003 | Werner, Jr. et al. | |
| 2004/0136045 A1 | 7/2004 | Tran | |
| 2005/0046918 A1 | 3/2005 | Yasuda et al. | |
| 2005/0174209 A1 | 8/2005 | Teshima et al. | |
| 2006/0001432 A1 | 1/2006 | Yasuda et al. | |
| 2006/0008284 A1 | 1/2006 | Ushimima et al. | |
| 2006/0158196 A1 * | 7/2006 | Ichimura et al. | 324/458 |
| 2006/0171728 A1 | 8/2006 | Ichimura et al. | |
| 2007/0154231 A1 | 7/2007 | Ichimura et al. | 399/73 |
| 2007/0229086 A1 | 10/2007 | Ichimura | 324/457 |
| 2007/0247166 A1 | 10/2007 | Ichimura et al. | 324/458 |

FOREIGN PATENT DOCUMENTS

| | | |
|---|---|---|
| DE | 34 10 527 A1 | 10/1984 |
| DE | 100 44 887 A1 | 5/2001 |
| EP | 1 234 799 A2 | 8/2002 |
| JP | 2-71166 | 3/1990 |
| JP | 4-25764 | 1/1992 |
| JP | 6-196721 | 7/1994 |
| JP | 6-196722 | 7/1994 |
| JP | 2000-180490 | 6/2000 |
| WO | 2004/088333 | 10/2004 |
| WO | 2004/088335 | 10/2004 |

OTHER PUBLICATIONS

P.S. Riehl, "Microsystems for Electrostatic Sensing" Dissertation, Nov. 2002, pp. 1-110 (available at http://www-bsac.eecs.berkeley.edu/publications/search/zoom.php?urltimestamp=1040564878).

* cited by examiner

FIG. 2A
(PRIOR ART)
FIG. 2B
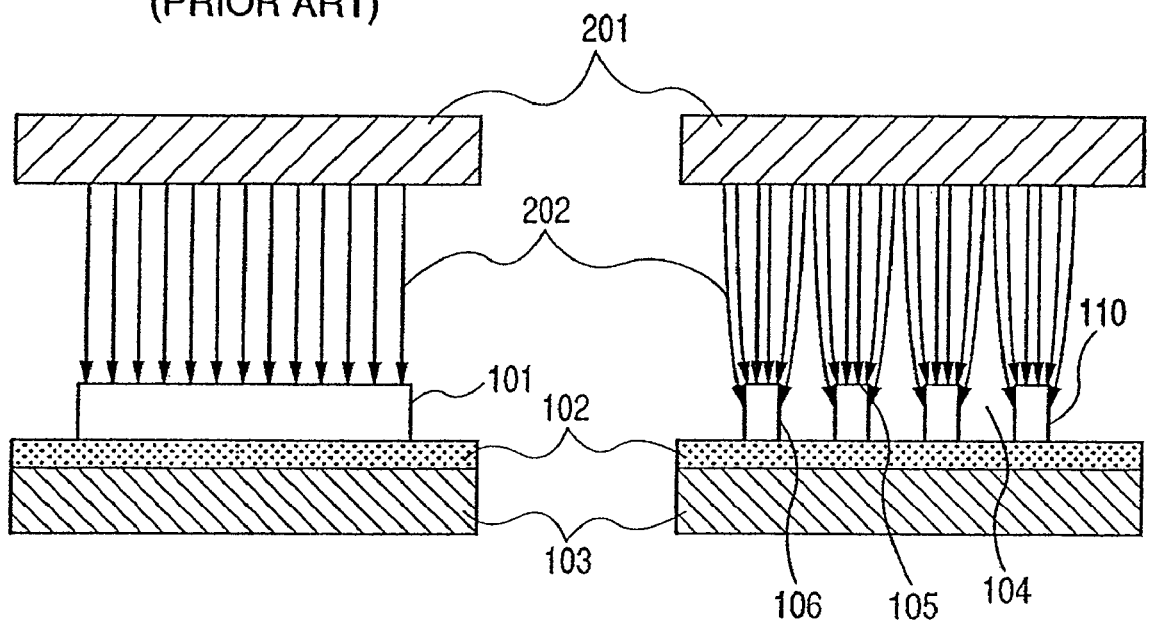
FIG. 3A
FIG. 3B
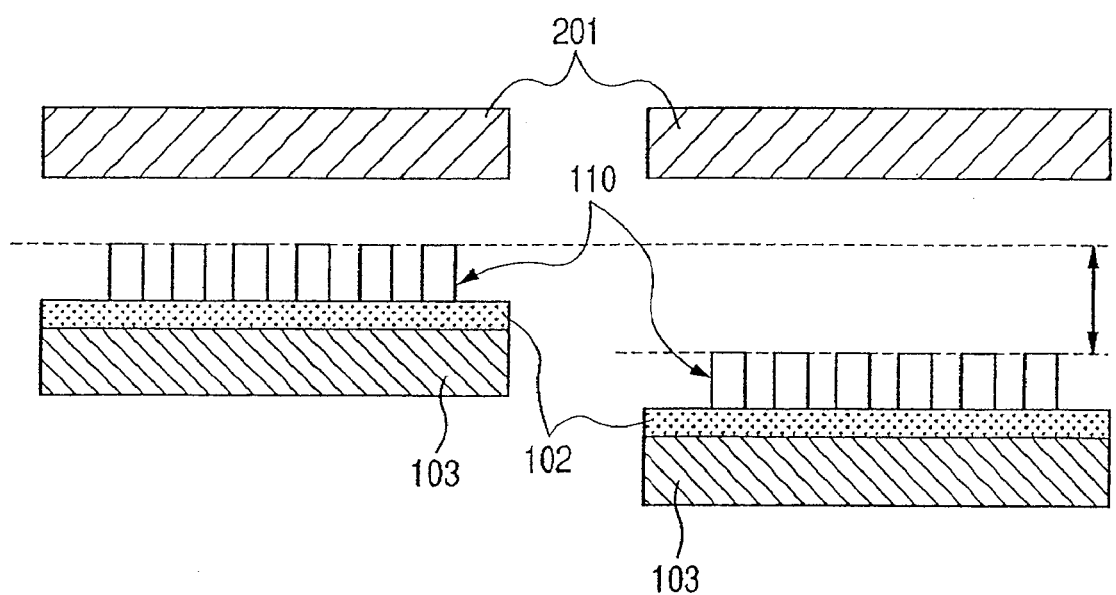

FIG. 4A
FIG. 4B
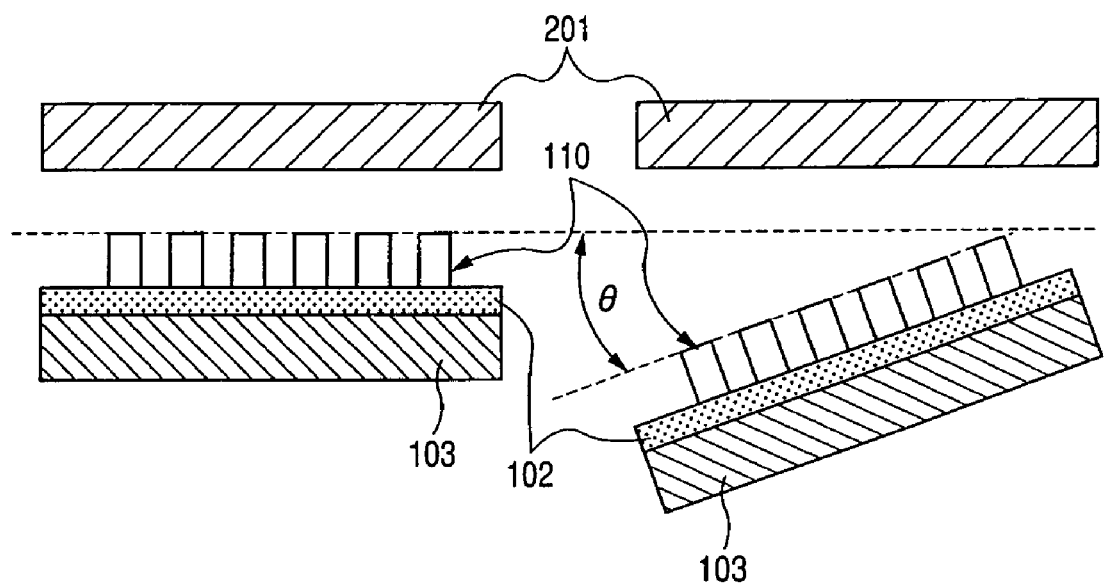
FIG. 4C
FIG. 4D
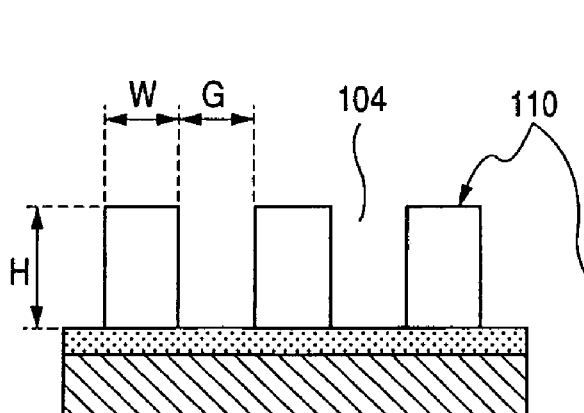
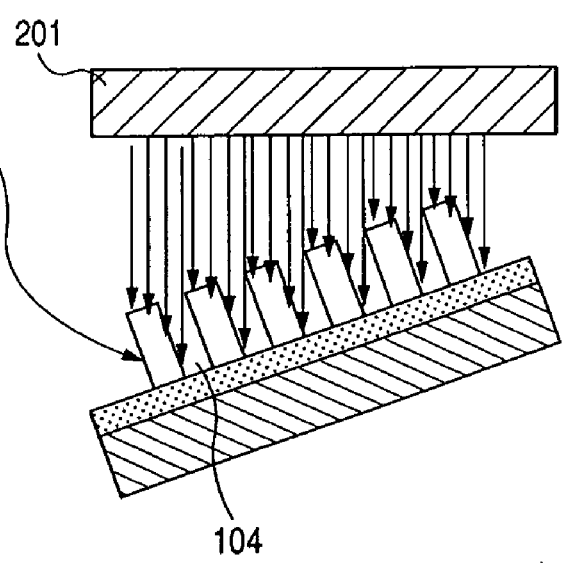

POTENTIAL MEASURING APPARATUS

BACKGROUND OF THE INVENTION

1. Field of the Invention

The present invention relates to a potential measuring apparatus for detecting a potential of a detection object through a quantity of electric charge generated in a detection electrode. The present invention also relates to an image forming apparatus equipped with this potential measuring apparatus.

2. Related Background Art

Japanese Patent Application Laid-Open No. 2000-180490 has proposed a potential measuring apparatus of a system that a distance between a detection object and a detection electrode is changed. This potential measuring apparatus comprises a piezoelectric tuning fork, an insulator and a detection electrode and has the construction of the so-called capacitor in which the insulator is formed between the detection electrode and the piezoelectric tuning fork. In this construction, electric charge is generated, increased and decreased at the detection electrode whose distance to the detection object is changed, and this increase and decrease of electric charge becomes an AC electric signal from the detection electrode.

U.S. Pat. No. 6,177,800 has proposed a potential measuring apparatus of a system that an area of a detection electrode as seen from a detection object is changed. This potential measuring apparatus is produced by the MEMS technique (application of a semiconductor process technique). In semiconductor processes, silicon is generally used as a substrate material. When the detection electrode is formed on silicon, an insulator is formed between the silicon and the detection electrode. Since silicon has a nature that electricity is passed through it, the so-called capacitor is constructed. In this construction, electric charge is generated, increased and decreased in the detection electrode, of which the area seen from the detection object is changed, and this increase and decrease of electric charge becomes an AC electric signal from the detection electrode.

The principle of generating an output signal in a potential measuring apparatus of a non-contact system, which is a system used in the potential measuring apparatus of the prior art and the potential measuring apparatus according to the present invention, will hereinafter be described.

When a distance (g) between the detection object and the detection electrode a dielectric constant ($\epsilon$) between the detection object and the detection electrode, organ area (s) of the detection electrode as seen from the detection object is changed, an electric (coupling) capacitance (C) induced between the detection object and the detection electrode is altered.

The electric capacitance (C) may be generally represented by the following equation (1):

$$C=(\epsilon \cdot s)/g \quad (1)$$

wherein $\epsilon[F \cdot m^{-1}]$ is a dielectric-constant between the detection object and the detection electrode, g [m] is a distance between the detection object and the detection electrode, and s [m$^2$] is an area of the detection electrode as seen from the detection object.

The electric capacitance (C) may also be represented by the following equation (2):

$$Q=C \times Vd \quad (2)$$

wherein Q is a quantity of electric charge, and Vd [V] is a potential of the detection object.

The equation (1) is substituted into the equation (2) to obtain the following equation (3):

$$Q=(\epsilon \cdot s)/g \times Vd \quad (3)$$

When the area of the detection electrode as seen from the detection object is changed with time (t), the equation (3) can be represented by the following equation (4). This change can be attained by, for example, letting in and out a shield plate formed of a conductive material or the like between the detection object and the detection electrode.

$$Q(t)=(\epsilon \cdot s(t))/g \times Vd \quad (4)$$

The equation (4) is differentiated with respect to the time (t) to obtain the following equation (5):

$$dQ(t)/dt=I(t)=(\epsilon/g \cdot ds(t)/dt) \times Vd \quad (5)$$

wherein the area change per time, ds(t)/dt, is a known value.

In this way, a current signal I(t) from the detection electrode is obtained in accordance with the equation (5). This signal is subjected to current-voltage conversion, whereby a voltage output signal V(t) can be obtained, and the potential Vd of the detection object can be found from the output signal V(t). When the distance (g) between the detection object and the detection electrode is changed with time (t), or a dielectric constant ($\epsilon$) between the detection object and the detection electrode is changed with time (t), it is also understood that a current signal I(t) from the detection electrode is obtained in accordance with the same way of thinking as described above.

However, in the potential measuring apparatus of the non-contact system, an electric capacitance (an electric capacitance exclusive of the electric capacitance generated with respect to the detection object; hereinafter also referred to as a parasitic capacitance) is generated between the detection electrode and a member present in the vicinity thereof. In some cases, a part of the electric signal generated at the detection electrode may flow into the member present in the vicinity of the electrode by this parasitic capacitance. Therefore, there is a possibility that the output signal from the detection electrode may be lowered. If a noise component is present in the member present in the vicinity of the detection electrode, the noise component flows into the detection electrode, so that the signal-to-noise ratio (S/N ratio) may be lowered in some cases. In the above-described prior art, this has not been taken into consideration.

SUMMARY OF THE INVENTION

There is provided a potential measuring apparatus comprising a detection electrode on which an electric charge is induced according to a potential of a detection object, and a altering means (or driving means) as a modulator for altering the generated quantity of the electric charges wherein the detection electrode has depressed and projected portions on a surface thereof opposite to the detection object, and the electrode is not present at the depressed portions.

A present invention is directed to a potential measuring apparatus comprising:

a detector having a detection electrode on which an electric charge is induced according to a potential of an object, said detection electrode being disposed on an insulating surface of a support member; and a modulator for altering a quantity of the electric charge which is induced on said detection electrode;

wherein said detector has depressed and projected portions on a surface thereof opposite to the object, and said detection electrode is not present at the depressed portions.

In this apparatus, the depressed portion includes, for example, at least one through hole or groove or both of them. According to such a construction, an electric charge can be effectively generated at an edge portion or a side wall formed by the depressed portion, or the hole and/or groove by electric lines of force from the detection object.

More specifically, the depressed portions, or the holes or grooves are provided as illustrated in FIGS. 1A and 1B, whereby edge portions and side walls are produced in the detection electrode, and on the other hand the area of the detection electrode opposite to a member for supporting the detection electrode is decreased. The area of the detection electrode as seen from the detection object is decreased, but the edge portions and side walls exist, so that electric lines of force also concentrate on the edge portions and side walls when a potential is generated between the detection object and the detection electrode. As a result, a difference in output signal between the presence of the depressed portions or the holes or grooves and the absence thereof can be eliminated almost completely or to some extent. On the other hand, since the area of the detection electrode opposite to the member for supporting the detection electrode is decreased, a parasitic capacitance generated between them can be lowered.

According to the present invention, there is also provided an image forming apparatus comprising the potential measuring apparatus described above and an image forming means, wherein the formation of an image by the image forming means is controlled by means of an output signal obtained from the potential measuring apparatus. This image forming apparatus carries the potential measuring apparatus according to the present invention, so that an output signal having a relatively high S/N ratio can be obtained to grasp an exact potential of a detection object, whereby a charging treatment and a developing treatment to the detection object can be appropriately performed.

According to the present invention, there is also provided a potential measuring apparatus comprising:
  a detection electrode on which an electric charge is induced according to a potential of an object, said detection electrode being disposed on an insulating surface of a support member;
  a modulator for altering a quantity of the electric charge which is induced on said detection electrode;
  wherein said detection electrode has a plurality of conductive portions disposed in isolation.

According to the present invention, there is also provided a potential measuring apparatus comprising:
  a detection electrode on which an electric charge is induced according to a potential of an object, said detection electrode being disposed on an insulating surface of a support member;
  a modulator for altering a quantity of the electric charge which is induced on said detection electrode; wherein said detection electrode has a conductive pattern so that discrete portions of the insulating surface are exposed and disposed in isolation.

BRIEF DESCRIPTION OF THE DRAWINGS

FIGS. 2A and 2B are cross-sectional views illustrating the relationship between the construction of the detection electrode and the distribution of electric lines of force shown in FIGS. 1A and 1B respectively;

FIGS. 3A and 3B are cross-sectional views illustrating an example of an operation for generating an output signal from the detection electrode;

FIGS. 4A, 4B, 4C and 4D are cross-sectional views illustrating another example of an operation for generating an output signal from the detection electrode;

DETAILED DESCRIPTION OF THE PREFERRED EMBODIMENTS

The present invention will hereinafter be described with reference to the drawings.

Figure 1A:
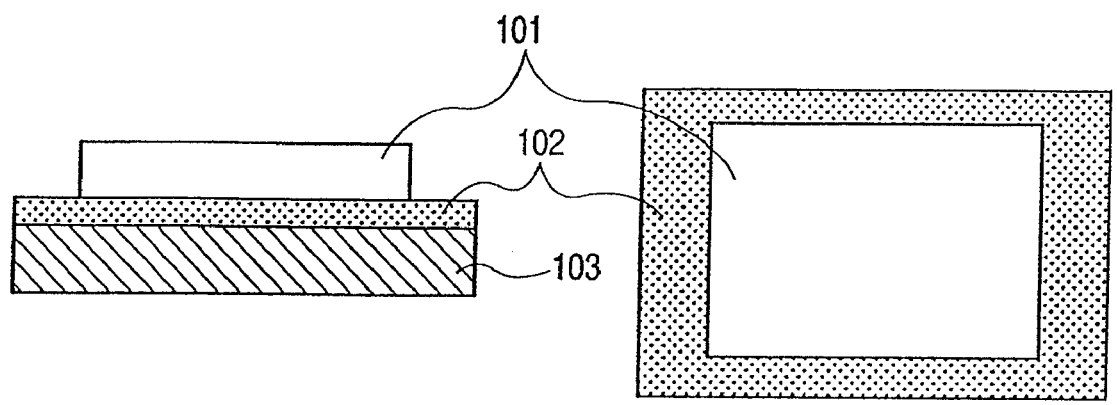
FIG. 1A illustrates the constitution of a detector of a conventional potential measuring apparatus.
Figure 1B:
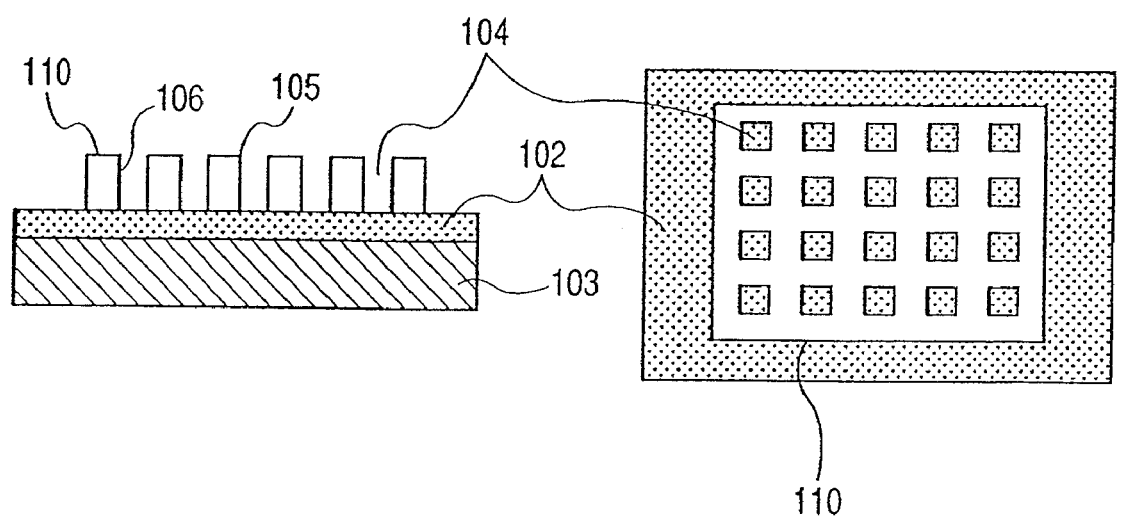
FIG. 1B illustrates the construction of a detector according to an embodiment of a potential measuring apparatus of the present invention in comparison with a conventional one shown in FIG. 1A.

FIG. 1B illustrates the construction in the vicinity of a detection electrode according to a first embodiment of a potential measuring apparatus of the present invention in comparison with an ordinary detection electrode of a potential measuring apparatus shown in FIG. 1A. FIG. 1A illustrates a section and a top face of the ordinary one before holes or grooves are formed in the detector. The detector comprises a detection electrode 101, an insulating layer 102 and a support member 103. FIG. 1B illustrates a section (a section in a face perpendicular to a support member 103) and a top face (a face where a detection electrode 110 is viewed from right above in a vertical direction) of a detection electrode 110 according to this embodiment, which is obtained by forming a plurality of through holes 104 in a flat plate-like detection electrode 101. The holes 104 almost perpendicular to the flat plate-like detection electrode 101 are formed, thereby effectively forming edge portions 105 having a substantially right angle and side walls 106 substantially vertically extending. The holes 104 completely passing through the electrode 110 are formed, whereby an area of the detection electrode 110 opposite to the support member 103 through the insulating layer 102 is decreased. The area of the detection electrode 110 opposite to the support member 103 is decreased, whereby a parasitic capacitance generated between them is lowered compared with the construction shown in FIG. 1A.

FIG. 2A is a cross-sectional view illustrating an arrangement relation between the detection electrode 101 before holes are formed and a detection object 201. FIG. 2B is a cross-sectional view illustrating an arrangement relation between the detection electrode 110 after holes 104 are formed and the detection object 201. When the detection object 201 is arranged so as to oppose to the detection electrode and a potential difference is created between the detection object 201 and the detection electrode 101 or 110, electric force lines 202 are generated. In the case of FIG. 2B, the area of the detection electrode 110 as seen from the detection object 201 is small compared with the case of FIG. 2A. However, almost the same output signal as in the case of FIG. 2A can be obtained because the electric force lines 202 concentrate on the edge portions 105, or reach the side walls 106. Even in this embodiment, a process for processing the output signal from the detection electrode 110 in a signal processing circuit on the basis of the principle described above to detect a potential of the detection object 201 is the same as the conventional process.

An example of the operation of the potential measuring apparatus according to this embodiment is described with reference to FIGS. 3A and 3B.

The potential measuring apparatus according to the present invention includes an altering means (also refereed to as a modulator) for arranging the detection object and the detection electrode so as to oppose to each other and for altering the generated quantity of the electric charge which is induced on the detection electrode.

The altering means (or the modulator) as used in the present invention is not particularly limited so far as it alters the generated quantity of the electric charge which is induced on the detection electrode. Typical examples of the altering means (or the modulator) include one which alters the generated quantity of the electric charge by altering the distance between the detection object and the detection electrode as well as one which alters the generated quantity of the electric charge by altering the amount of electric lines of force that reach, the detection electrode from the detection object using a shutter or the like put between the detection object and the detection electrode.

In the case where the distance between the detection electrode 110 and the detection object 201 is changed, thereby obtaining an output signal according to the potential of the detection object, for example, the detection electrode 110 is moved upward and downward in a direction substantially perpendicular to a face of the detection electrode 110 as illustrated in FIGS. 3A and 3B. To achieve such movement, for example, a driving means or altering means is used in which a beam is formed at the support member 103, piezoelectric elements are formed on the beam or the support member, and voltage is applied to the piezoelectric elements to utilize their changes of shape. The detection electrode may also be moved by forming a fixed-electrode on a part of the beam or support member so as to face a neighboring electrode for generating electrostatic attraction force and applying voltage between the electrodes to generate electrostatic attraction force. Further, the detection electrode may be moved by a driving means in which a coil (or magnet) is formed on the beam, support member or the like, a magnet (or coil) is formed in the vicinity thereof, and a current is allowed to flow through the coil to generate magnetic force, thereby producing repulsion force or attraction force between the coil and the magnet.

The present invention is not limited to the driving means described above, and a motor vibration heat or the like may also be used.

The distance between the detection electrode 110 and the detection object 201 may also be changed as illustrated in FIGS. 4A to 4D. In this case, the detection electrode 110 is inclined as illustrated in FIGS. 4A to 4D, thereby changing not only the distance, but also an area of the detection electrode 110 as seen from the detection object 201. An output signal can be thereby more enlarged. The same driving method as in the driving means illustrated in FIGS. 3A and 3B can be used for achieving such movement.

In this case, supposing that the inclined angle of the detection electrode 110 is θ, the width of each of the holes or grooves 104 is G, and the thickness of the detection electrode 110 is H as illustrated in FIGS. 4B and 4C, the bottoms of the holes or grooves 104 become in a state of not being seen from, the detection object 201 as illustrated in FIG. 4D so far as the following equation (6) is satisfied. In other words, almost all electric lines of force coming from the detection object 201 to the area within the outermost contour of the detection electrode 110 become in a state of being received by the detection electrode 110 like the case where the holes or grooves 104 are not formed. As a result, an output signal equivalent to the output signal obtained by using the detection electrode 101, in which the holes or grooves 104 are not formed can be obtained.

$$\tan \theta \geq G/H \qquad (6)$$

In this case, the area of the detection electrode 110 opposed to the support member 103 through the insulating layer 102 can be made smaller as the width W of the detection electrode 110 is smaller, so that a parasitic capacitance can be made small. It goes without saying that the electric lines of force concentrate on the edge portions 105 of the detection electrode 110 as described in the case of FIG. 2B even when the inclined angle of the detection electrode 110 is smaller than the above θ. The electric lines of force further reach the side walls 106. Accordingly, an output signal close to the output signal obtained by using the detection electrode 101, in which the holes or grooves 104 are not formed, can be obtained.

An output signal may also be obtained by changing a dielectric constant between the detection object 201 and the detection electrode 110 as illustrated in FIGS. 5A to 5D. This also means that the area of the detection electrode 110 as seen from the detection object 201 is changed by inserting a shield plate between the detection object 201 and the detection electrode 110. When the output signal is obtained by changing the dielectric constant (ε) or the area (s) in the above-described manner, a material (dielectric 501) having a dielectric constant different from that of the surroundings is let in and out between the detection object and the detection electrode. Alternatively, a conductor is let in and out. The same method as that by the driving means illustrated in FIGS. 3A and 3B may be used for the purpose of letting the dielectric or conductor in and out. In order to change the dielectric constant between the detection object 201 and the detection electrode 110, for example, the dielectric constant of the material provided between the detection object 201 and the detection electrode 110 may also be changed by electrical control in addition to the above-described method.

Figures 5A, 5B:
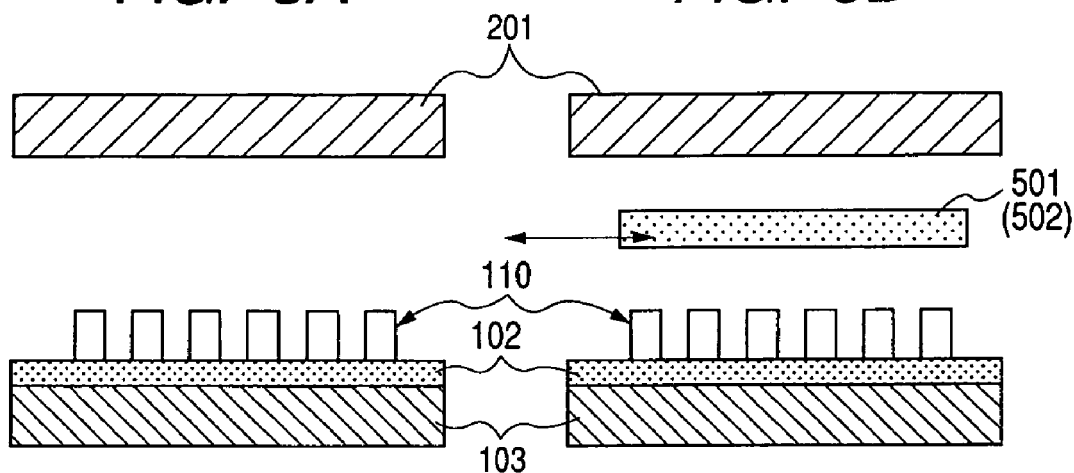
FIGS. 5A, 5B, 5C and 5D illustrate a further example of an operation for generating an output signal from the detection electrode.
Figure 5C:
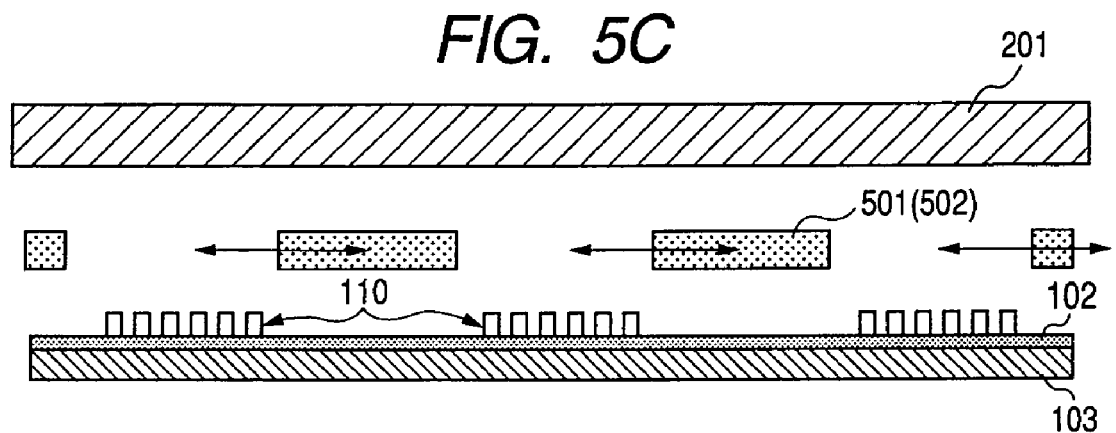
Figure 5D:
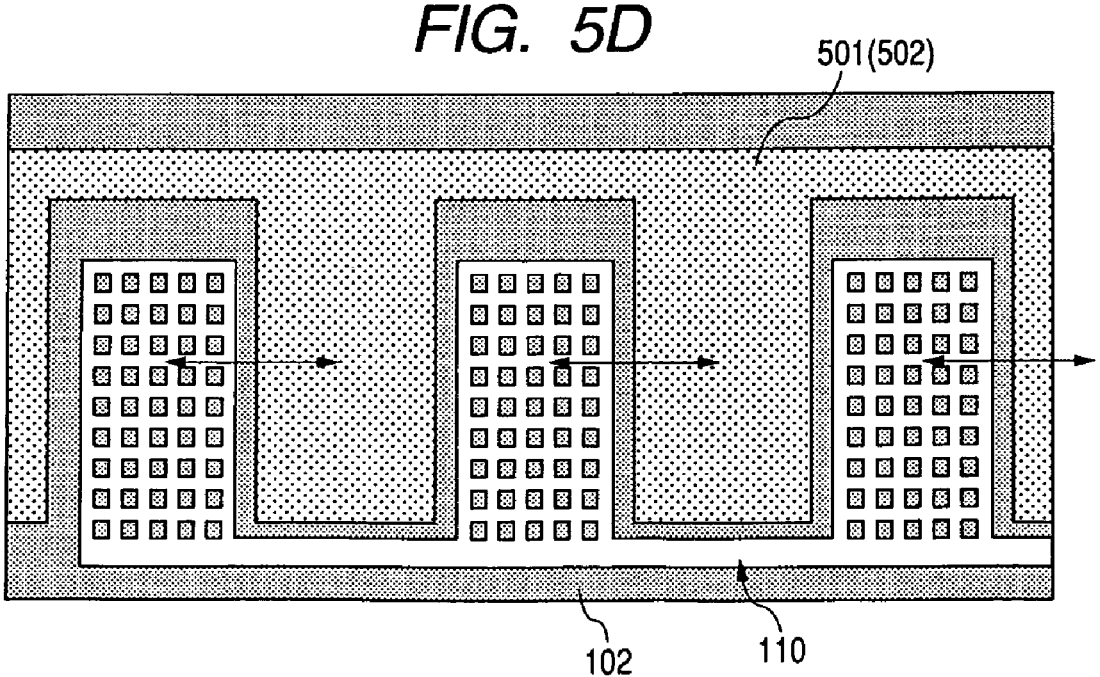

When a plurality of the constructions illustrated in FIG. 5B are arranged (in a state that a plurality of the detection electrodes 110 are electrically connected to each other), an output signal as large as the arranged number of the detection electrodes can be obtained. When a construction in which the dielectrics 501 or the conductors 502 are partially connected to each other is used a plurality of the dielectrics 501 or the conductors 502 may also be moved at once by one source of driving. FIG. 5C illustrates a section taken along a plane perpendicular to the support member 103, and FIG. 5D illustrates a top face where a plurality of the detection electrodes 110 are viewed from right above in a vertical direction.

The methods for obtaining the above-described various output signals may be used in various combinations. For example, the dielectric 501 or the conductor 502 may be let in and out between the detection object 201 and the detection electrode 110 while vertically moving the detection electrode 110. An output signal greater in amplitude can be thereby obtained.

Figure 6A:
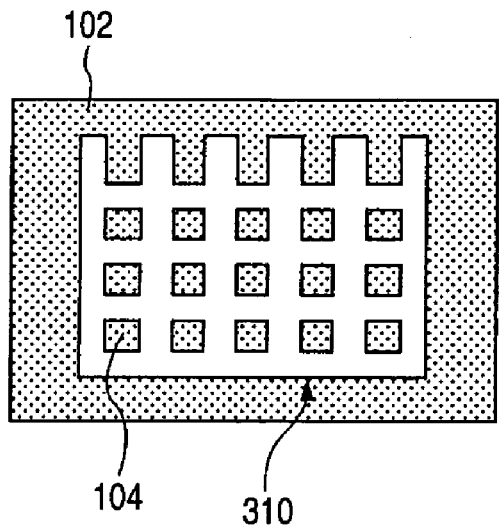
FIGS. 6A, 6B, 6C and 6D are plan views illustrating the constructions of detection electrodes according to other embodiments in the potential measuring apparatus of the present invention.
Figure 6B:
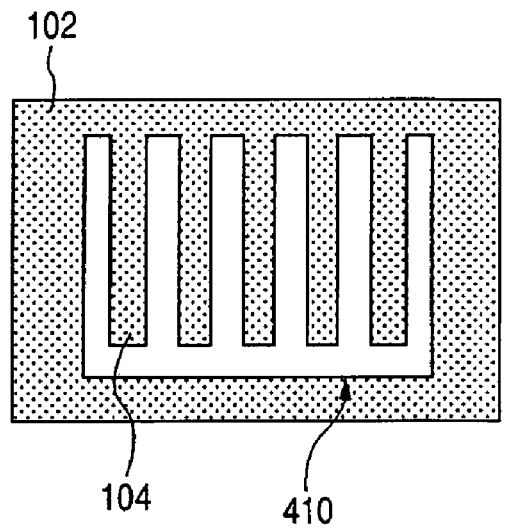
Figure 6C:
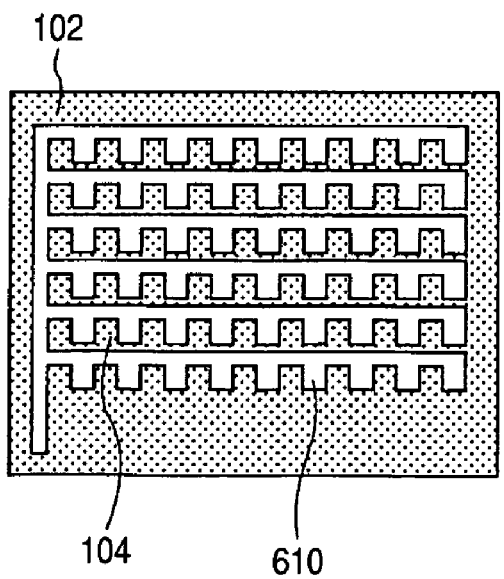
Figure 6D:
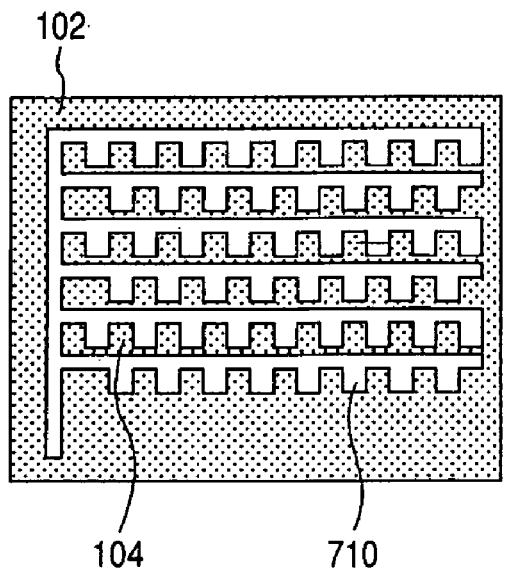

FIGS. 6A and 6B and 6C and 6D illustrating a top face where the detection electrodes 110 is viewed from right above in a vertical direction respectively illustrates the forms of detection electrodes 310 and 410 and 610 and 710 according to further embodiments in the potential measuring apparatus of the present invention. The form of each hole 104 may be either polygonal or circular (elliptic). Some of the holes 104 may be opened out at a side of the detection electrode 310 as illustrated in FIG. 6A. Alternatively, the detection electrode may have such a construction that grooves 104 long in one direction and opened out at a side of the detection-electrode 410 are formed as illustrated in FIG. 6B. Furthermore, the detection electrode may also have such a construction that rectangular grooves are combined with a groove extending in one direction as illustrated in FIGS. 6C and 6D.

The groove may be formed not only linearly but also curvilinearly.

The depressed portions formed in the detection electrode may be holes or grooves some of which do not pass through, or may be formed not only in a regular pattern, but also in a somewhat random pattern. The pattern viewed from above is not limited to a rectangular form, but may also be a curvilinear form. However, it is desirable that many edge portions are present at the holes or grooves because the electric lines of force are likely to concentrate thereon.

Figure 7:
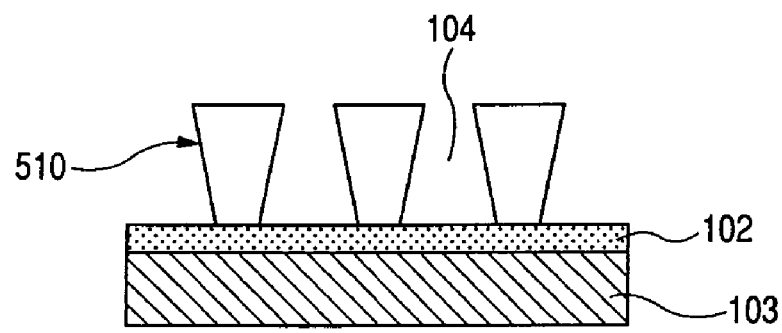
FIG. 7 is a cross-sectional view illustrating the sectional construction of a detection electrode according to a further embodiment in the potential measuring apparatus of the present invention.

FIG. 7 is a cross-sectional view illustrating the sectional construction (a sectional form taken along a plane perpendicular to the support member 103) of a detection electrode according to a still further embodiment of the potential measuring apparatus of the present invention. It is not necessary that the side wall of the hole or groove 104 is perpendicular to the flat plate-like support member 103 as shown in the above-described embodiments. The sectional form may preferably be of a reverse tapered form as illustrated in FIG. 7. The reverse tapered form keeps large the area of the detection electrode 510 as seen from the detection object, while further reducing the area of the detection electrode 510 opposite to the support member 103. Accordingly, using the detection electrode 510 having the reverse tapered form achieves a high S/N ratio. In this case, even when the sectional form (generally referred to as a forward tapered form) is a tapered form in which the inclination is reverse to that shown in FIG. 7, the effect of the present invention may be exhibited to a certain extent. Even when the edge portion 105 in FIG. 1B is not in an angular form, but is in a form including a curved surface, the effect of the present invention may also be exhibited to a certain extent.

Table 1 showing a relationship between the rate of the respective dimensions of the detection electrode 110 illustrated in FIG. 4C and the percentage reduction of output will hereinafter be described.

TABLE 1

| Type | Width W of detection electrode | Width G of hole or groove | Height H of detection electrode | Percentage reduction of output | Percentage reduction of parasitic capacitance |
|---|---|---|---|---|---|
| (1) | 1 | 2 | 5 | About 2% | About 67% |
| (2) | 2 | 4 | 5 | About 10% | About 67% |
| (3) | 2 | 4 | 1 | About 33% | About 67% |
| (4) | 4 | 8 | 1 | About 50% | About 67% |

ANSYS (electromagnetic field analyzing software; product of Cybernet Systems Co., Ltd.) is used in determining the above relationship. The intensity of the output signal obtained in the case where neither holes nor grooves are formed in the detection electrode is regarded as 100% to show the percentage reduction of output signal in the case where grooves 104 are formed. The groove pattern of the detection electrode 110 in this embodiment is the so-called line-and-space pattern as illustrated in FIG. 6B.

First, since the ratio of the width G of the groove to the width W of the detection electrode is 2 in any type, it is understood that the area of the detection electrode 110 opposite to the support member 103 can be reduced to about 67%. The parasitic capacitance can also be thereby reduced by almost the same percentage as in the area. Second, it is understood that the percentage reduction of output becomes low as the height H of the detection electrode 110 increases. The percentage reduction % of output can be suppressed to about 2% in the dimensional ratio of, for example, the type (1).

It is understood from the above results that the parasitic capacitance can be reduced to a relatively considerable extent with the output signal hardly reduced or not too much reduced by forming the depressed portions including either one or both of the through holes and grooves in the detection electrode. When the absolute value of the height H of the detection electrode can hot be increased so much (for example, when the detection electrode is formed by a film forming method such as sputtering or vapor deposition), the construction of the type (1) can be relatively created by decreasing the width W of the detection electrode and the width G or the holes or grooves. In this case, the number of the holes or grooves is increased when the size, form and the like of the outermost contour of the detection electrode are fixed.

In Table 1, the ratio of the width W of the detection electrode to the width G of the holes or grooves is 1:2. When this ratio is, for example, 1:a value-greater than 2, however, the percentage reduction of output comes to increase. In order to prevent this, it is only necessary to increase the height H of the detection electrode.

Figure 8:
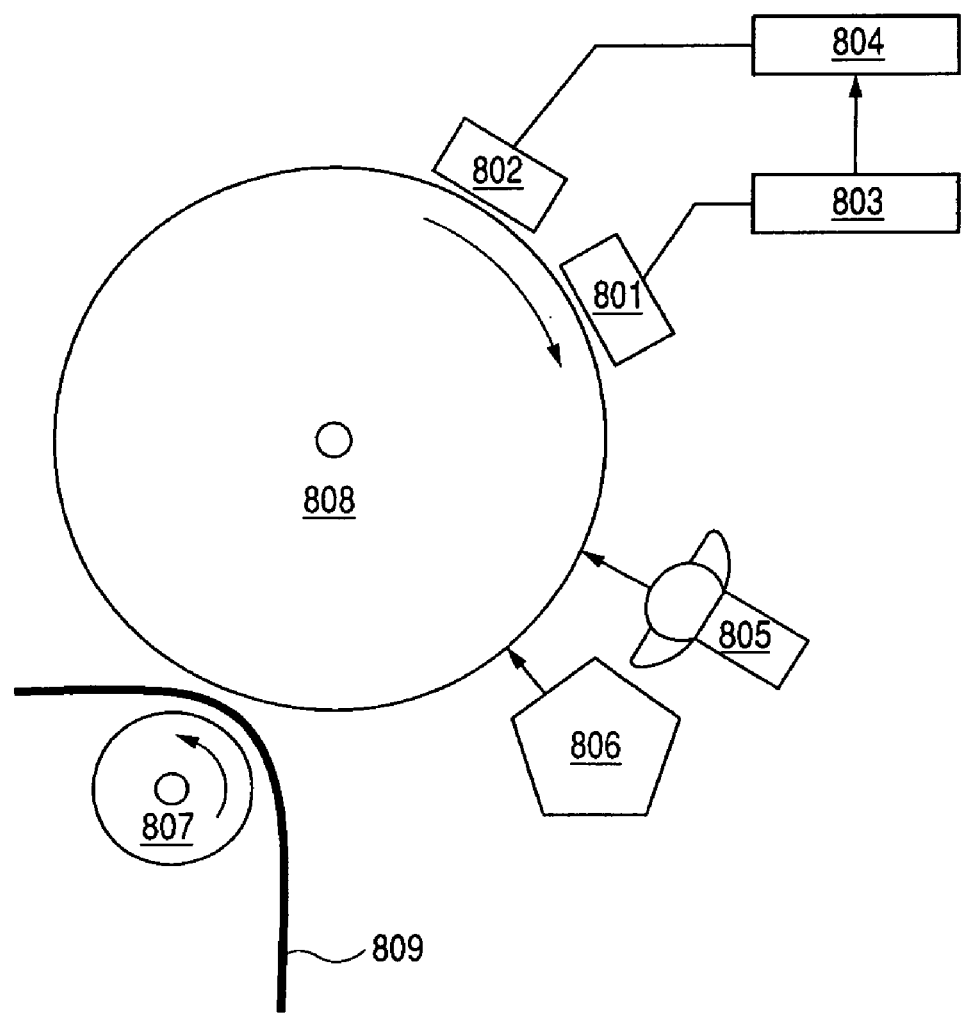
FIG. 8 illustrates the construction of an exemplary image forming apparatus, in which the potential measuring apparatus according to the present invention is installed.

FIG. 8 illustrates a typical construction of an exemplary image forming apparatus, in which the potential measuring apparatus according to the present invention is installed. This image forming apparatus comprises a potential measuring apparatus 801 according to the present invention, a charger 802, a signal processor 803, a high voltage generator 804, an exposer 805, a toner supply system 806, a transfer-printing medium feed roller 807, a photosensitive drum 808 as a photoreceptor and a transfer-printing medium 809.

The apparatus is operated in the following manner. (1) The drum 808 is charged by the charger 802. (2) The charged portion is exposed with the exposer 805 to obtain a latent image. (3) A toner is applied to the latent image by the toner supply system 806 to obtain a toner image. (4) The toner image is transferred to the transfer-printing medium 809. (5) The toner on the transfer-printing medium 809 is melted and fixed. The formation of an image is achieved through these steps. At this time, the charged state of the drum 808 is determined by the potential measuring apparatus 801, and the result thereof is processed by means of the signal processor 803 and feedback is carried out onto the high voltage generator 804 as needed, whereby stable charging of the drum can be realized to realize stable formation of an image.

According to the above-described potential measuring apparatus of the present invention, a parasitic capacitance can be reduced with the quantity of an electric capacitance generated between the detection object and the detection electrode hardly reduced or not too much reduced by virtue of such unique form of the detection electrode as described above, and so the S/N ratio can be made relatively high. The image forming apparatus, in which the potential measuring apparatus according to the present invention is installed, permits forming an image of relatively high quality on the basis of relatively accurate information as to the potential of a detection object, which is obtained by the potential measuring apparatus according to the present invention.

This application claims priority from Japanese Patent Application No. 2005-156461 filed on May 27, 2005, which is hereby incorporated by reference herein

What is claimed is:

1. A potential measuring apparatus comprising:
    a detector having a detection electrode on which an electric charge is induced according to a potential of an object, said detection electrode having a first surface disposed on an insulating surface of a support member and a second surface opposite to the first surface; and
    a modulator for altering a quantity of the electric charge which is induced on said detection electrode,
    wherein said detection electrode is a continuous piece of material having a plurality of depressed portions formed therein and extending between the second surface and the first surface, such that an area of the second surface is larger than an area of the first surface.

2. The potential measuring apparatus according to claim 1, wherein the depressed portions of the detection electrode include at least one of a through hole and a through groove.

3. The potential measuring apparatus according to claim 1, wherein the modulator alters a distance between the object and the detection electrode.

4. The potential measuring apparatus according to claim 1, wherein the modulator alters an inclination of the detection electrode to the object to change a distance between the object and the detection electrode or to change an area of the detection electrode as seen from the object.

5. The potential measuring apparatus according to claim 1, wherein the modulator alters a dielectric constant between the object and the detection electrode.

6. The potential measuring apparatus according to claim 1, wherein the modulator lets a shield member in and out between the object and the detection electrode to change an area of the detection electrode as seen from the object.

7. An image forming apparatus comprising the potential measuring apparatus according to claim 1 and an image forming means comprising a photoreceptor as the object, wherein formation of an image by the image forming means is controlled by means of an output signal obtained from the potential measuring apparatus.

* * * * *